(12) United States Patent
Farjadrad et al.

(10) Patent No.: US 7,818,649 B1
(45) Date of Patent: Oct. 19, 2010

(54) EFFICIENT MESSAGE PASSING SCHEME OF ITERATIVE ERROR CORRECTING DECODERS

(75) Inventors: Ramin Farjadrad, Mt. View, CA (US); Saied Benyamin, Calabasas, CA (US)

(73) Assignee: Aquantia Corporation, Milpitas, CA (US)

( * ) Notice: Subject to any disclaimer, the term of this patent is extended or adjusted under 35 U.S.C. 154(b) by 993 days.

(21) Appl. No.: 11/607,416

(22) Filed: Nov. 30, 2006

Related U.S. Application Data

(60) Provisional application No. 60/740,816, filed on Nov. 30, 2005.

(51) Int. Cl.
*H03M 13/00* (2006.01)
(52) U.S. Cl. ........................ 714/758; 714/781
(58) Field of Classification Search .......... 714/758, 714/781
See application file for complete search history.

(56) References Cited

U.S. PATENT DOCUMENTS

| | | | | |
|---|---|---|---|---|
| 4,907,186 A * | 3/1990 | Racey | ........................ | 710/57 |
| 6,633,856 B2 * | 10/2003 | Richardson et al. | ........... | 706/15 |
| 6,938,196 B2 * | 8/2005 | Richardson et al. | ......... | 714/752 |
| 6,957,375 B2 * | 10/2005 | Richardson | ................. | 714/752 |
| 6,961,888 B2 * | 11/2005 | Jin et al. | ..................... | 714/752 |
| 7,127,659 B2 * | 10/2006 | Richardson et al. | ......... | 714/758 |
| 7,133,853 B2 * | 11/2006 | Richardson et al. | ........... | 706/15 |
| 7,231,557 B2 * | 6/2007 | Jin et al. | ..................... | 714/701 |
| 7,237,171 B2 * | 6/2007 | Richardson | ................. | 714/752 |
| 7,395,490 B2 * | 7/2008 | Richardson et al. | ......... | 714/779 |
| 7,441,178 B2 * | 10/2008 | Xin | ........................... | 714/800 |
| 7,552,097 B2 * | 6/2009 | Richardson et al. | ........... | 706/15 |
| 7,571,375 B2 * | 8/2009 | Kim et al. | ................... | 714/786 |
| 7,617,432 B2 * | 11/2009 | Novichkov et al. | ......... | 714/752 |
| 7,627,801 B2 * | 12/2009 | Jin et al. | ..................... | 714/757 |

* cited by examiner

*Primary Examiner*—Joseph D Torres
(74) *Attorney, Agent, or Firm*—Sawyer Law Group, P.C.

(57) ABSTRACT

A decoder and method for implementing an iterative error correcting decoder are provided for decoding a codeword consisting of a N-bit messages. In one implementation, the decoder includes a first set of nodes, and a second set of nodes, each having N bits of resolution. Each node of the second set is coupled to at least one node of the first set, each node of the second set being coupled to a node of the first set by a corresponding set of M wires. Each of the first set of nodes is operable to transfer the bits of a given N-bit message of the codeword over the corresponding set of M wires to a coupled node of the second set during a single iteration cycle, each of the M wires carrying i bits, where N is an integer greater than M, and N=M*i.

20 Claims, 4 Drawing Sheets

FIG. 1

EFFICIENT MESSAGE PASSING SCHEME OF ITERATIVE ERROR CORRECTING DECODERS

CROSS-REFERENCE TO RELATED APPLICATIONS

This application claims benefit under 35 USC 119(e) of Provisional Application No. 60/740,816, filed on Nov. 30, 2005, which is incorporated by reference herein in its entirety.

FIELD OF THE INVENTION

The present invention relates generally to data communications, and more particularly to error correction in data communications.

BACKGROUND OF THE INVENTION

An error correcting decoder is typically implemented, e.g., in a network system, to reduce communication errors. One type of an error correcting decoder is an iterative error correcting decoder. Iterative error correcting decoders typically use a large-scale parallel network of nodes performing soft probability calculation. These nodes exchange probability information of a received data block among one another. After a certain number of iterations within an iterative decoder structure, individual noisy information in a data block (or codeword) is transformed into an estimate of the codeword as a whole—i.e., the probabilities associated with received bit values iterate between these two node functions to finally resolve the most probable value of each data bit. Examples of iterative decoders are the low density parity check (LDPC) decoders, Hamming decoders, Turbo decoders, and the like.

The structure of an iterative error correcting decoder can be represented graphically by a factor graph. Factor graphs are the graphical representation of the linear space of codewords (e.g., LDPC codewords). A factor graph consists of nodes and edges, where the edges are simply the wire connections between the nodes, while a node represents a function of its inputs. For example, in a low density parity check (LDPC) factor graph, there are two types of nodes representing two distinct functions—i.e., "equality constraint" nodes and "parity check" nodes. According to the IEEE 802.3ae (10 GBASE-T) standard, the proposed LDPC decoder consists of (2048) equality constraint nodes and (384) parity check nodes. Each equality constraint node has (6) bidirectional connections to corresponding parity constraint nodes and each parity check node has a total of (32) bidirectional connections to corresponding equality constraint nodes. This results in a factor graph with a network matrix of (12,228) bidirectional connections, where each connection consists of two sets of wires having an N-bit width. For example, in a parallel LDPC iterative decoder with a message resolution of 8 bits, the decoder would contain a total of 196,608 wires.

LDPC code is specified by a parity check matrix (which is commonly referred to as an H matrix) having a very few number of "ones" per row. An example of an H matrix 100 is shown in FIG. 1. The length of each codeword is equal to the number of columns in the H matrix 100. In one example, each codeword is created such that the parity of each set of bits corresponding to the "ones" in a row is even. The number of rows corresponds to the number of parity checks that the codeword must satisfy. Therefore, if all errors in a received codeword are corrected by the decoder, all parity checks must be satisfied for the output codeword.

An important feature of one implementation of an iterative decoder is the number of iterations that the iterative decoder can perform on an input codeword in a given amount of time as it relates to the bit error rate (BER) of the iterative decoder. A higher number of iterations results in a better BER performance of an iterative decoder. Therefore, to maximize the performance of a single iterative decoder, it is generally preferred to have the iterative decoder perform a higher number of iterations (which affects the BER performance of a given iterative decoder). Therefore, parallel processing of the data is the clear way to increase the number of iterations in such decoders. For example parallel LDPC architectures have a notable speed advantage to their serial counterpart, at the price of higher number of processing cells and complexity. At the same time, as discussed above, the performance of an iterative decoder is limited by the resolution of the probability messages. An iterative decoder with low-bit resolution requires more iterations to attempt to deliver the same performance (as compared to an iterative decoder with a high-bit resolution) and will usually hit error floors preventing the iterative decoder from achieving the same BER, meaning with an increased signal-to-noise ratio (SNR) insignificant BER improvement is achieved. FIG. 2 shows simulations demonstrating the error floor as a result of finite message resolution. However, passing messages at a high rate and a high resolution between the nodes is very expensive in terms of area and power.

Thus, passing messages between the nodes in an LDPC iterative decoder having a parallel architecture requires a substantial amount of power as the number of wires in such an implementation is extremely high (~200K in 10 GBase-T code) and an average length of the wires is very long (estimated to be 6-8 mm in 10 GBase-T code (for, e.g., 90 nm technology)). In other architectures of an LDPC iterative decoder, such as serial or parallel-serial message processing architectures, the overall power consumption is higher although the length and size of wires are smaller. This is mainly due to the replacement of the wire matrix of connections with registers that need to run at a speed that is a multiple of that required by the parallel architecture. Although the amount of logic reduces, designing the logic for higher speed, translates to higher power due to use of high drive logic cells, more pipelining, more buffering, and also higher leakage devices.

One of the important features of an iterative decoder is that as the decoder settles to the final corrected word, the average rate at which the messages change reduces significantly. This feature helps significantly reduce the power consumption in the connection matrix of a parallel LDPC iterative decoder. This is because each message has its own dedicated N-bit wire in each direction and digital power is only consumed for those few bits that toggle as the message value is settled. Conventional serial and parallel-serial constructions do not enjoy this benefit as same set of N-bit wire is multiplexed to carry bits from different nodes.

BRIEF SUMMARY OF THE INVENTION

In general, in one aspect, this specification describes an iterative error correcting decoder operable to decode a codeword, in which the codeword consists of a plurality of N-bit messages. The iterative error correcting decoder includes a first set of nodes each having N bits of resolution, and a second set of nodes each having N bits of resolution. Each node of the second set of nodes is coupled to at least one node of the first set of nodes, each node of the second set of nodes being coupled to a node of the first set of nodes by a corresponding set of M wires. Each node of the first set of nodes is operable to transfer the bits of a given N-bit message of the codeword over the corresponding set of M wires to a coupled node of the second set of nodes during a single iteration cycle, each of the M wires carrying i bits, where N is an integer greater than M, and N=M*i.

The details of one or more implementations are set forth in the accompanying drawings and the description below. Other features and advantages will be apparent from the description and drawings.

BRIEF DESCRIPTION OF THE DRAWINGS

FIG. 1 is a diagram of an H matrix.

Like reference symbols in the various drawings indicate like elements.

DETAILED DESCRIPTION OF THE INVENTION

The present invention relates generally to data communications, and more particularly to error correction in data communications. The following description is presented to enable one of ordinary skill in the art to make and use the invention and is provided in the context of a patent application and its requirements. The present invention is not intended to be limited to the implementations shown but is to be accorded the widest scope consistent with the principles and features described herein.

Figure 2:
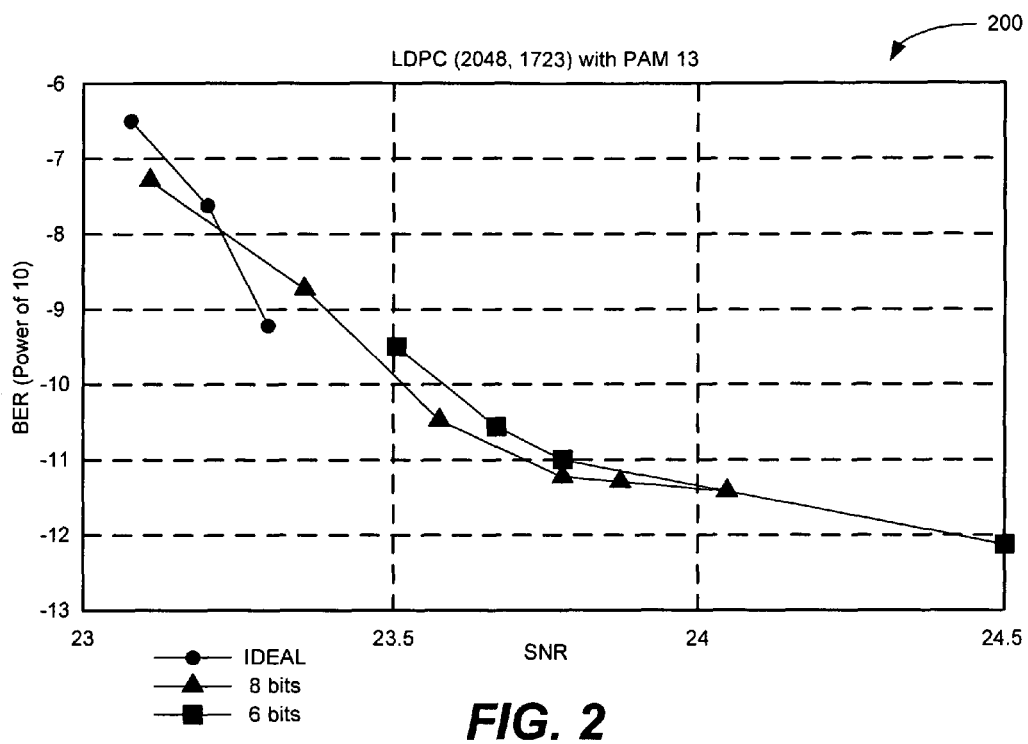
FIG. 2 is a graph of a BER-SNR curve of error floors due to finite message resolution.
Figure 3:
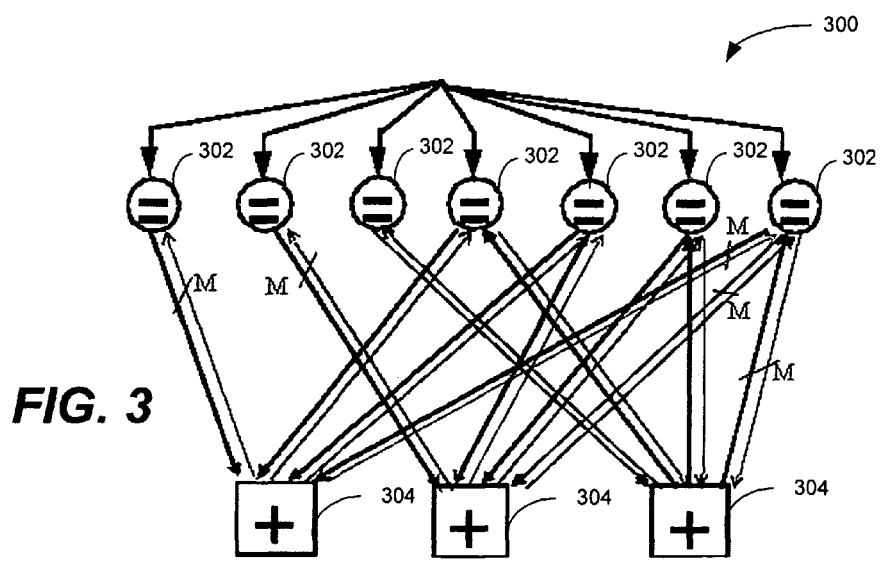
FIG. 3 illustrates a block diagram of an iterative decoder including a first set of nodes and a second set of nodes in accordance with one implementation.

FIG. 3 illustrates a block diagram of an iterative decoder 300 having a reduced amount of wiring between nodes relative to conventional iterative decoders in accordance with one implementation. In general, the iterative decoder 300 can be a low density parity check (LDPC) decoder, Hamming decoder, Turbo decoder, or the like. In one implementation, the iterative decoder 300 includes a first set of nodes 302 having N bits of resolution, and a second set of nodes 304 also having N bits of resolution. The first set of nodes 302 can be equality constraint nodes and the second set of nodes 304 can be parity check nodes. In one implementation, the iterative decoder 300 further includes a corresponding set of M wires between each of a subset of the second nodes 304 and a subset of the nodes 302, as shown in FIG. 3. Unlike a conventional iterative decoder that transfers only 1 bit per wire during each iteration, the iterative decoder 300 is operable to transfer i bits per wire for each iteration, where i>1. Accordingly, in one implementation, the iterative decoder 300 includes a number of wires M (between a given first node 302 and a given second node 304) such that N>M, and N=M*i. For example, in a case with the first set of nodes 302 and the second set of nodes 304 each having 8 bits of resolution, instead of using 8 wires between a given first node 302 and a given second node 304, the iterative decoder 300 includes only 4 wires between the first node 302 and the second node 304, and 2 bits are transferred (e.g., multiplexed) on each wire in every iteration. In another example, the iterative decoder 300 need only have 1 wire between a given first node 302 and a given second node 304, and in such a case, 8 bits would be transferred (e.g., multiplexed) over the single wire. In one implementation, an N-input multiplexer (not shown) with sequentially enabled select signals is implemented within the iterative decoder 300 to multiplex multiple bits onto a given wire. In another implementation, an N-bit shift register is implemented within the iterative decoder 300, in which data bits are loaded into the N-bit shift register in parallel and shifted out serially.

In an implementation of the iterative decoder 300 in which the first set of nodes 302 are equality constraint nodes and the second set of nodes 304 are parity check nodes, each parity check node needs to operate on a corresponding subset of equality constraint nodes' messages calculated in a previous iteration and vice versa. That means in each iteration, messages are only passed from the equality constraint nodes to the parity check nodes (or vice versa), and messages are not simultaneously passed bi-directionally between the two sets of nodes. Accordingly, the same wire that is used to send a message from an equality constraint node to a parity check node can also be used to send a message back from parity check node to equality constraint node. Thus, (in one implementation) tri-stated buffers are implemented on both sides of a given wire that are activated for each node when the node transmits data and is deactivated when the node receives data. Performing bidirectional transmission on the same line again reduces the number of wires by a factor of two.

Therefore, by applying the two above techniques, the total number of wires in a connection matrix of an iterative decoder having 8-bit messages can be reduced by a factor of 16, as serializing the 8 bits into one wire provides a factor of 8 reduction and bidirectional transmission lead to another factor of 2 reduction. As a result a significant reduction in area and congestion in the routing of the connection matrix can be achieved, leading to considerably reduced wire capacitance as well. For example, in one implementation, such a reduction in wires required within an iterative decoder permits the iterative decoder to include wires composed of higher level metals with large spacing.

Figure 4:
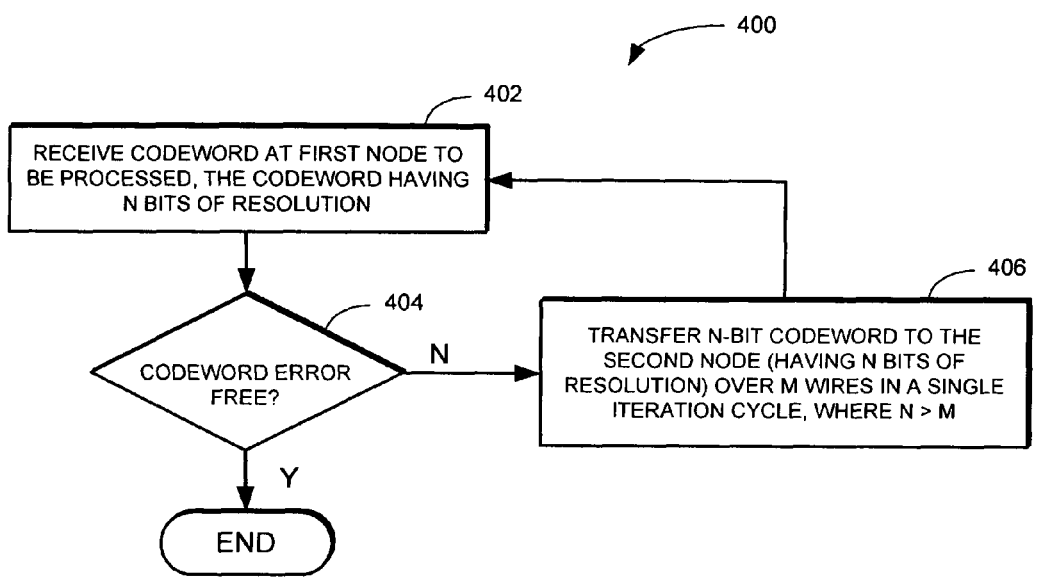
FIG. 4 illustrates a method for passing a codeword between nodes within an iterative decoder in accordance with one implementation.

FIG. 4 illustrates a method for passing a message (of a codeword) between nodes within an iterative decoder (e.g., iterative decoder 300) in accordance with one implementation. A codeword consisting of a plurality of N-bit messages is received at a first set of nodes (e.g., the first set of nodes 302) of the iterative decoder, in which each of the first set of nodes has N bits of resolution (step 402). In one implementation, each of the first set of nodes is an equality constraint node. In general, after a certain number of iterations within an iterative decoder structure, individual noisy information in the codeword is transformed into an estimate of the codeword as a whole—i.e., the probabilities associated with received message values iterate between two node functions (of the iterative decoder) to finally resolve the most probable value of each data bit. Accordingly, a determination is made whether the codeword is error free (step 404). If the codeword is error free, then the method 400 ends. If, however, the codeword is not error free, then the N-bit messages of the codeword are transferred to a second set of nodes (e.g., the second set of nodes 304) of the iterative decoder, each message being transferred over a corresponding set of M wires in a single iteration cycle, where N is an integer greater than M (step 406). In one implementation, each of the second set of nodes also has N-bits of resolution. In one implementation, each of the second set of nodes is a parity check constraint node. In one implementation, the number of bits i transferred over each wire is given by the following equation:

$$i = N/M$$

where M is the number of wires between a node of the first set and a node of the second set, and N is the number of bits of resolution associated with each node. In one implementation, the iteration cycle during which the N-bit messages of the codeword are transferred to the second set of nodes from the first set of nodes consists of i clock cycles. Then each of the N-bit messages of the codeword are transferred back to the first node over the corresponding set of M wires in a single iteration cycle, and the method 400 returns to step 402, as discussed above.

One drawback associated with the above scheme, however, is that switching activity does not reduce in the connection matrix as the iterative decoder settles towards a final estimated codeword, in contrast to conventional parallel unidirectional connections. For example, if the value on one connection from an equality constraint node to a parity check node from [00000000] settles to [01010010] in 2 iterations, then no further switching power is burnt for a parallel connection, but there will always be 3 up and 3 down toggles (to send the three 1's) for a serial connection. Thus, the toggles in a serial approach (even when most messages have settled) will result in significant power consumption.

In one implementation, to eliminate the power disadvantage of the serial message passing scheme compared to full parallel approach, instead of communicating the whole codeword in every iteration, each node transmits a "1" only for the bits that have changed in the codeword and send a "0" for those bits of the codeword that have not changed. In this implementation, the transmission of bits is performed in a non-return to zero (NRZ) fashion to avoid transitions. In this case, when a codeword has settled to any given value, as long as none of the bits change, a stream of 0's will be transmitted between nodes and no switching power will be consumed. This scheme also works very well for bidirectional transmission of bits on a wire, since as long as the codeword between the two nodes have settled, the wire will stay at zero and cease toggling.

In one implementation, difference data transmission is employed through use of a XOR gate per bit (at a given node) to XOR new codeword bits with the old codeword bits, and the result thereof is transmitted from the node. On the receive side, the same XOR logic is employed to XOR the received bits with the previously received codeword bits. As each side needs to transmit and receive, (in one implementation) the XOR gates are shared for both directions to avoid extra logic. Starting from the beginning of the decoding cycle, both sides can start with a reset value of all zeros for all codewords. In the first iteration, (in one implementation) the actual codeword values are in fact transmitted, as the XOR of zero with any bit results in the same bit value. However, in future cycles, only the difference of the previous codeword and the new codeword is sent, and as long as variation in the codeword value is minimal (or if there is no variation), power consumption by the iterative decoder will be significantly reduced.

Figure 5:
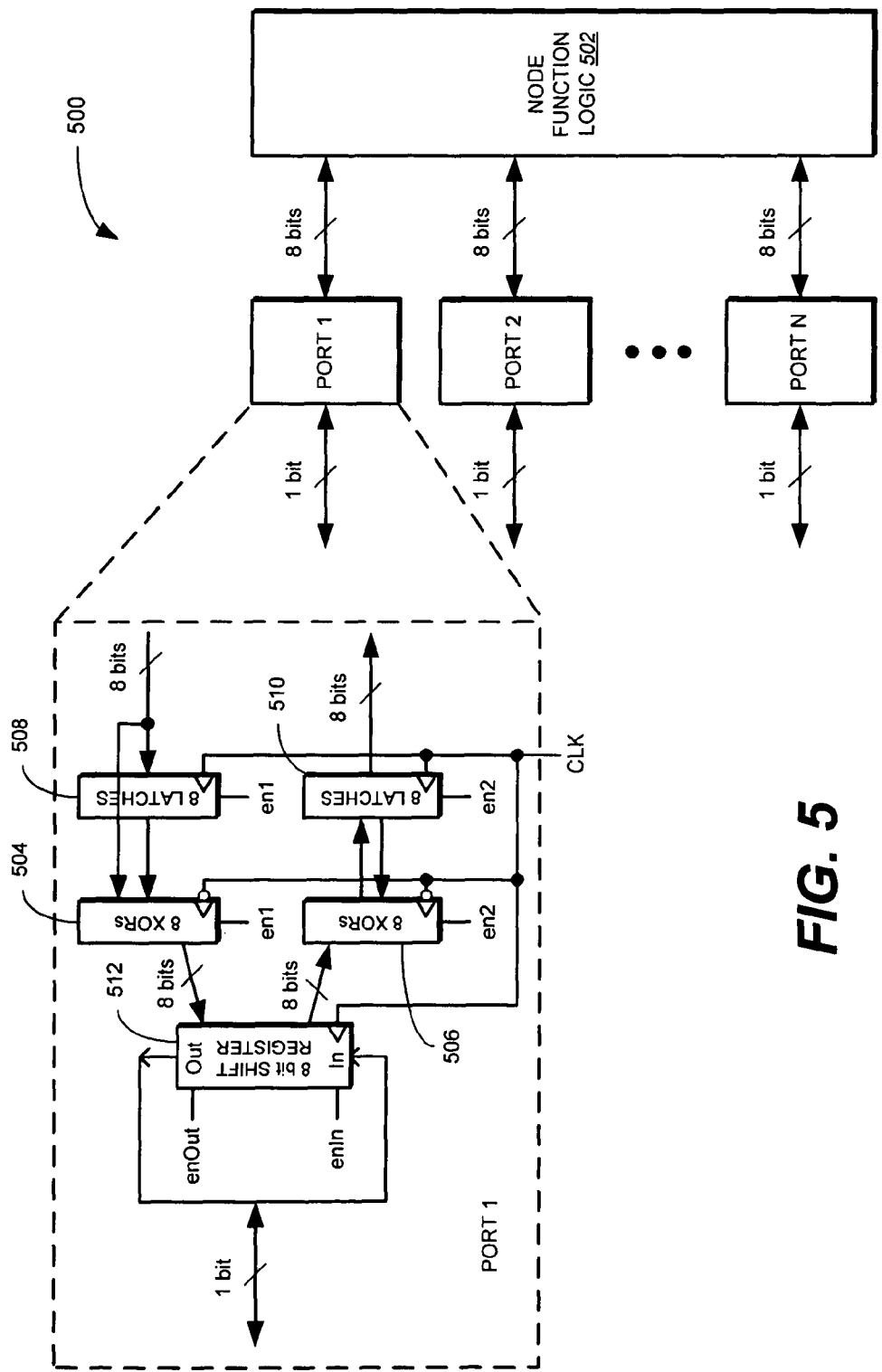
FIG. 5 illustrates a block diagram a node within an iterative decoder in accordance with one implementation.

FIG. 5 illustrates an example of a node 500 of an iterative decoder in accordance with one implementation. The node 500 can be an equality constraint node or a parity check node. As shown, the node 500 includes node function logic 502 and N message passing ports. An expanded view of Port 1 is shown in FIG. 5. The additional logic blocks included within the node 500 (as compared to a conventional approach to perform the proposed serializing and difference message passing) include two XOR blocks 504, 506 (a total of 16 XORs), latches 508, 510 (a total of 16 latches), and an 8-bit shift register block 512. The node 500 further includes enable signals en1, en2, enIn that respectively enable the clocking of each of the XOR blocks 504, 506, and the -bit shift register block 512. In one implementation, the enable signals en1, en2 are controlled by a shared, top level sequence scheduler (not shown). In one implementation, the XOR blocks 504, 506 have a latched input (e.g., pass-gate switches at the input) that are clocked by opposite phase of the clock to relax the timing race from output of the latches 508, 510 to the input of the XOR blocks 504, 506. In one implementation, the 8-bit shift register block 512 can both read/write data in parallel mode and in serial mode. The input and the output of the 8-bit shift register block 512 are shorted assuming that the output has a tri-state buffer that is disabled during serial receive mode. In the receive mode, when all 8 bits of data are read in serially, the data is written out parallel in the next cycle, and in the transmit mode the 8-bit data is read in parallel into the 8-bit shift register block 512 and clocked out serially on one wire.

Please note, however, that the 8-bit parallel data and 1-bit serial data implementation shown in FIG. 5 is exemplary, and it should be noted that the proposed invention is general and covers any resolution for the input and output width of the message passing ports. As an example, the parallel data can be increased to 10 bits and the output serial bits can have a width of 2 wires, such that 5 bits out of every 10 parallel bits are sent on one wire. It should be noted that by doing so, the clock frequency can be halved, while the amount of logic will not double, and only the number of interconnection wires doubles. This can lead to further power saving of the port circuitry that typically accounts for the majority of the power consumption.

In one implementation, further power saving can be achieved through further reduction of the transition rate on the connection wires by applying only one transition for each bit of "1" that denotes a difference, instead of sending a pulse that can result in two transitions (one up and one down). Of course extra circuitry is needed to modulate and demodulate the data in such a form. It can be shown that the circuit overhead for performing this function can be small if the serialization is high, meaning serializing output/input data to 1 bit resulting to least amount of overhead. An example implementation in a 1-bit serial message passing is by having an XOR gate at the input that compares the current serial data bit with a previous data bit from a previous clock cycle and generates an output pulse of "1" where there is a change in the serial line value. Now, the output of this XOR gate can be used as input from channel fed to the input ports of FIG. 5. On the output side, each output from output ports of FIG. 5 goes through a toggle circuit whose output is toggled from "0" to "1" (or vice versa) every time there is an output logic "1". This second XOR operation to reduce the transition density can be also performed in a parallel fashion on the data in the registers in each port before serializing the data out. However, the parallel implementation of this function takes more logic gates. Accordingly, in one implementation, data is XOR'ed in two stages—i.e., once on the parallel data prior to serialization and once after serialization.

Various implementations of an iterative decoder have been described. Nevertheless, one of ordinary skill in the art will readily recognize that there that various modifications may be made to the implementations, and those variations would be within the scope of the present invention. For example, though examples described above generally described with respect to an iterative decoder, the techniques are applicable to other types of decoders. In addition, the techniques described herein can be applicable to satellite communications (e.g., DVB-S2 (Digital Video Broadcasting)), MIMO-OFDMA cellular systems, as well as read-channel for hard discs, and other systems. Accordingly, many modifications may be made without departing from the scope of the present invention.

What is claimed is:

1. An iterative error correcting decoder operable to decode a codeword, the codeword consisting of a plurality of N-bit messages, the iterative error correcting decoder comprising:
   a first set of nodes each having N bits of resolution; and
   a second set of nodes each having N bits of resolution, each node of the second set of nodes being coupled to at least one node of the first set of nodes, each node of the second set of nodes being coupled to a node of the first set of nodes by a corresponding set of M wires, wherein each node of the first set of nodes is operable to transfer the bits of a given N-bit message of the codeword over the corresponding set of M wires to a coupled node of the second set of nodes during a single iteration cycle, each of the M wires carrying i bits, where N is an integer greater than M, and N=M*i, wherein the first set of nodes and the second set of nodes implement a difference data transmission scheme in which each of the first set of nodes and each of the second set of nodes transmits only a first signal for those bits of a given N-bit message that have been changed, and transmits a second signal, different than the first signal, for those bits of the N-bit message that have not changed.

2. The iterative error correcting decoder of claim 1, wherein:

the first set of nodes comprises equality constraint nodes; and the second set of nodes comprises parity check nodes.

3. The iterative error correcting decoder of claim 1, further comprising a first N-input multiplexer respectively coupled to each of the first set of nodes, each first N-input multiplexer to time multiplex the i bits of a given message over each of the corresponding set of M wires to a corresponding node of the second set of nodes during the single iteration cycle.

4. The iterative error correcting decoder of claim 1, further comprising a first N-bit shift register coupled to each of the first set of nodes, each first N-bit shift register operable to load each of the i bits of a given message in a parallel manner from a corresponding node of the first set of nodes and shift the i bits of a given message serially over each of the corresponding set of M wires to a corresponding node of the second set of nodes during the single iteration cycle.

5. The iterative error correcting decoder of claim 1, wherein each of the first set of nodes and each of the second set of nodes bi-directionally transmit the N-bit messages to one another over the corresponding set of M wires.

6. The iterative error correcting decoder of claim 5, further comprising a first tri-state buffer and a second tri-state buffer respectively coupled to each node of the first set of nodes and to each node of the second set of nodes, wherein the first tri-state buffer is activated responsive to a given node of the first set of nodes transmitting a given N-bit message and is deactivated responsive to the node of the first set of nodes received the N-bit message, and the second tri-state buffer is activated responsive to a given node of the second set of nodes transmitting a given N-bit message and is deactivated responsive to the second node receiving the N-bit message.

7. The iterative error correcting decoder of claim 1, wherein the first signal represents a "1" value and the second signal represents a "0" value.

8. The iterative error correcting decoder of claim 1, wherein each of the first set of nodes and each of the second set of nodes comprises XOR logic to implement the difference data transmission scheme.

9. The iterative error correcting decoder of claim 8, wherein each of the first set of nodes and each of the second set of nodes comprises a plurality of latches respectively coupled an input of corresponding XOR logic to latch an input to the XOR logic.

10. The iterative error correcting decoder of claim 9, wherein the XOR logic and the plurality of latches are respectively enabled by an opposite phase of a clock.

11. The iterative error correcting decoder of claim 1, wherein the iterative error correcting decoder is one of a low density parity check (LDPC) decoder, a Hamming decoder, or a Turbo decoder.

12. A method for decoding an N-bit message associated with a codeword using an iterative error correcting decoder, the method comprising:

providing a first node having N bits of resolution in the iterative error correcting decoder;

providing a second node having N bits of resolution in the iterative error correcting decoder, the second node being coupled to the first node through M wires; and transferring i bits of the N-bit message over each of the M wires from the first node to the second node during a single iteration cycle, where N is an integer greater than M, and N=M*i, wherein the first node and the second node implement a difference data transmission scheme in which each of the first node and the second set of node transmits only a first signal for those bits of the N-bit message that have been changed, and transmits a second signal, different than the first signal, for those bits of the N-bit message that have not changed.

13. The method of claim 12, wherein:

providing a first node comprises providing an equality constraint node; and providing a second node comprises providing a parity check node.

14. The method of claim 12, further comprising coupling a first N-input multiplexer to the first node, the first N-input multiplexer to time multiplex the i bits over each of the M wires to the second node during the single iteration cycle.

15. The method of claim 12, further comprising a first N-bit shift register to the first node, the first N-bit shift register operable to load each of the i bits in a parallel manner from the first node and shift the i bits serially over each of the M wires to the second node during the single iteration cycle.

16. The method of claim 12, wherein the first node and the second node bi-directionally transmit the N-bit message to one another over the M wires.

17. The method of claim 16, wherein the first node comprises a first tri-state buffer and the second node comprises a second tri-state buffer, and the method further includes:

activating the first tri-state buffer responsive to the first node transmitting the N-bit message and deactivating the first tri-state buffer responsive to the first node receiving the N-bit message, and activating the second tri-state buffer responsive to the second node transmitting the N-bit message and deactivating the second tri-state buffer responsive to the second node receiving the N-bit message.

18. The method of claim 12, wherein the first signal represents a "1" value and the second signal represents a "0" value.

19. The method of claim 12, wherein the first node and the second node each comprises XOR logic to implement the difference data transmission scheme.

20. The method of claim 12, wherein the iterative error correcting decoder is one of a low density parity check (LDPC) decoder, a Hamming decoder, or a Turbo decoder.

* * * * *